(12) United States Patent
Nishihara et al.

(10) Patent No.: US 6,765,814 B2
(45) Date of Patent: Jul. 20, 2004

(54) SEMICONDUCTOR MEMORY DEVICE

(75) Inventors: Ryuji Nishihara, Takatsuki (JP);
Hiroyuki Sadakata, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/315,042

(22) Filed: Dec. 10, 2002

(65) Prior Publication Data

US 2003/0107911 A1 Jun. 12, 2003

(30) Foreign Application Priority Data

Dec. 12, 2001 (JP) .......................... 2001-378047

(51) Int. Cl.[7] .............................. G11C 5/06; G11C 5/02
(52) U.S. Cl. ........................................... 365/63; 365/51
(58) Field of Search ........................... 365/63, 51, 149, 365/148

(56) References Cited

U.S. PATENT DOCUMENTS

| | | | |
|---|---|---|---|
| 4,012,757 A | | 3/1977 | Koo |
| 4,198,695 A | | 4/1980 | McElroy |
| 5,708,620 A | * | 1/1998 | Jeong ................ 365/230.06 |
| 5,940,315 A | | 8/1999 | Cowles |
| 6,266,264 B1 | | 7/2001 | Proebsting |

* cited by examiner

Primary Examiner—Thong Le
(74) Attorney, Agent, or Firm—Stevens, Davis, Miller & Mosher, LLP

(57) ABSTRACT

Strap lines are provided in a layer above word lines so that the word lines and the strap lines are connected to each other in strapping regions separately provided at the ends of memory cell array portions in a conventional semiconductor memory device having a problem wherein the area of the memory cell array portions is increased. Each memory cell is formed of a MOS transistor and a MOS capacitor in a layout of a memory cell array portion according to a standard CMOS process. Memory cells of this structure have a sufficiently large pitch between bit lines and, therefore, contacts for connecting word lines to strap lines in an upper layer are provided between the bit lines, as low resistance metal wires, in the same layer as the bit lines. Thereby, it becomes unnecessary to separately provide strapping regions at the ends of memory cell array portions and it becomes unnecessary to increase the intervals between the memory cells by increasing the size of the memory cell in the layout according to the standard CMOS process and, therefore, contacts for strapping word lines can be provided for each memory cell, without increasing the area of memory cell array portions or the chip area, so that the propagation delay of drive signals in word lines can be reduced and high speed memory operation can be implemented.

6 Claims, 4 Drawing Sheets

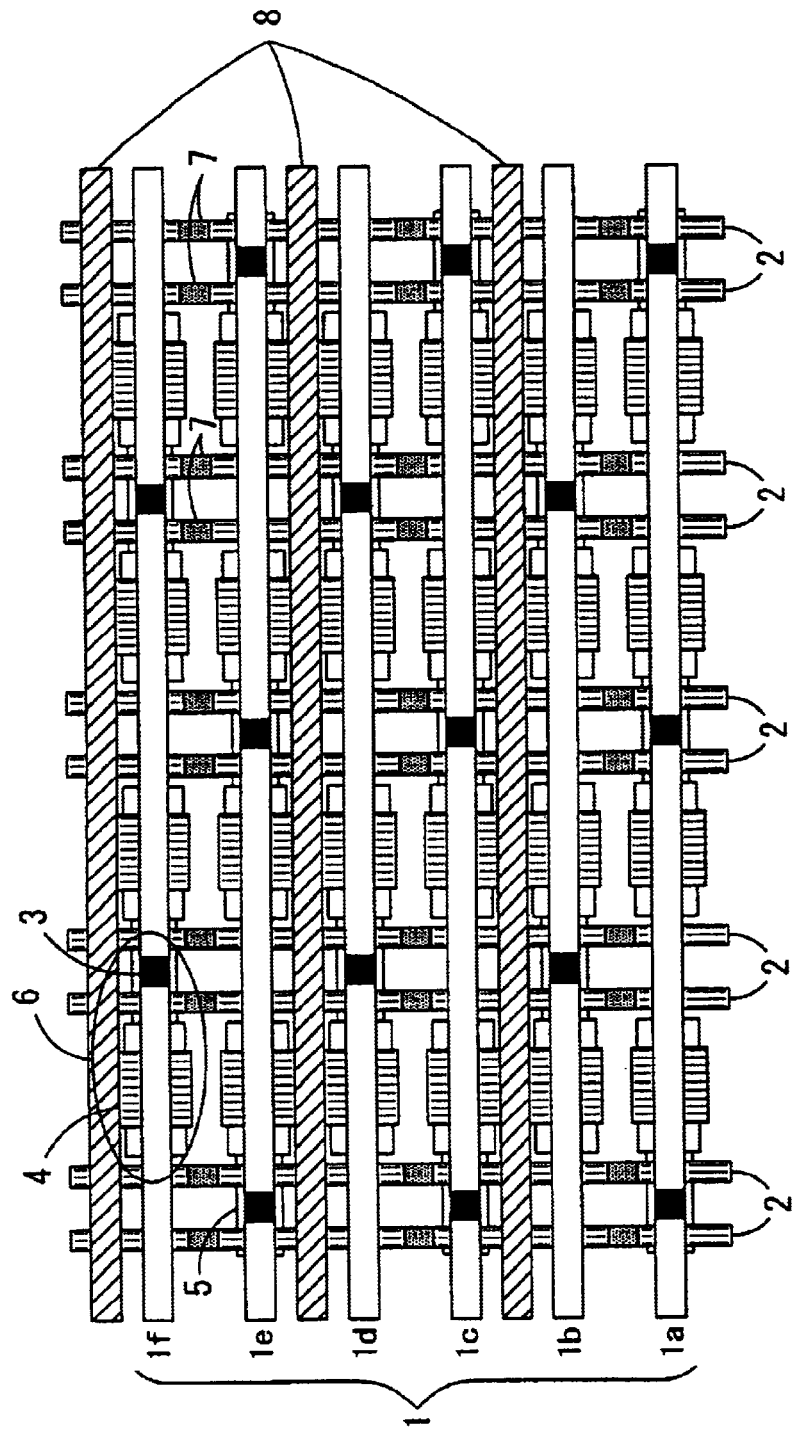

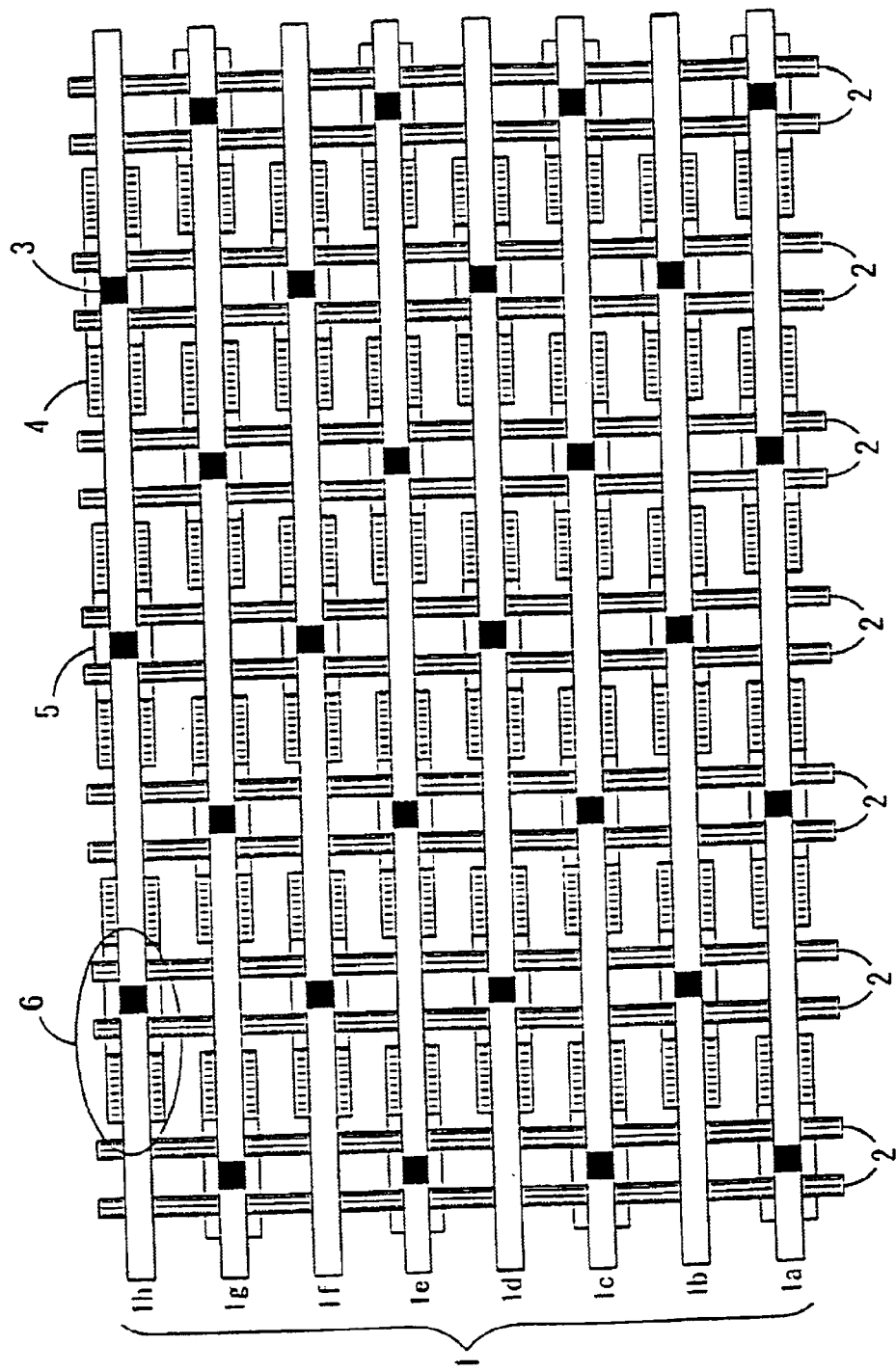

SEMICONDUCTOR MEMORY DEVICE

BACKGROUND OF THE INVENTION

1. Field of the Invention

The present invention relates to a semiconductor memory device.

2. Description of the Background Art

FIG. 4 shows a layout diagram of a memory cell array of a DRAM (Dynamic Random Access Memory), which is one type of semiconductor memory device designed using a conventional process for a DRAM integrated chip. In FIG. 4, bit lines formed of first layer aluminum wires are denoted as 1a to 1h. Word lines, formed of polysilicon wires, aligned in the direction crossing the bit lines for working as gate electrodes of the transistors that selectively connect memory cells to bit lines are denoted as 2. In addition, bit line contacts for electrically connecting bit lines 1 to memory cell transistors 5 are denoted as 3, memory cell capacitors are denoted as 4 and memory cell transistors are denoted as 5. 1Tr1C-type memory cells arranged at respective points of intersection of word lines 2 and bit lines 1, and formed of memory cell capacitors 4 and memory cell transistors 5, are denoted as 6, wherein memory cells 6 are connected to word lines 2 and bit lines 1.

In a conventional semiconductor memory device formed as described above, the resistance of polysilicon that forms word lines 2 is high and, therefore, it takes a very long time for data of a memory cell 6 to be transferred to a bit line 1 after application of a drive signal to a word line 2 has been started so that high speed memory operation is hampered in the case that word lines 2 are long.

In such a configuration, propagation delay of a signal from the driving end to the terminal end of a word line 2 is great and, therefore, a word line strap structure (word shunt structure) is used in order to limit to the minimum such delay. In a DRAM wherein such a word line strap structure is used, propagation delay of drive signals is prevented by strapping word lines 2 to upper layer low resistance metal wires (second layer aluminum wires), which become strapped wires formed according to the same pitch as word lines 2.

In recent years, a multi-layer wire structure has been adopted in place of conventional single-layer wires in the layout for DRAMs in order to reduce cell array size by narrowing the pitch of the wire pattern so as to achieve high integration. The distance between bit lines becomes very narrow in a DRAM wherein a multi-layer wire structure has been adopted. Therefore, strap contact regions become larger than the dimensions between wires, which are simply determined by the size of memory cells, in a memory cell array portion. In addition, contacts for strap connections (strap contacts) are formed of the same wire layer as the bit lines (first layer aluminum wires, for example) and, therefore, there is a defect wherein the distance between bit lines must be widened by providing sufficient space between memory cells as a result of enlargement of the total size of the memory cells in order to secure space for providing strap contacts for each memory cell.

That is to say, in recent years, DRAMs have three-dimensional structures, such as a stacked (layered) type or a trench type where special processes are used so as to achieve high integration and high capacitance in order to secure a large capacitance value in a small area for the capacitor structure of memory cells in comparison with the conventional planar-type capacitor and, thereby, though memory cells can be formed in a small area, the intervals between bit lines become too narrow for strap contacts to be provided for each memory cell, so that the configuration for strap connection can only be adopted by separately providing strapping regions at the ends of the memory cell array.

Though a word line strap structure that can prevent word line signal delays formed of polysilicon having a high resistance must be used in order to enable high speed memory operation in the above described manner, a problem arises wherein it is necessary to separately provide strapping regions at the ends of the memory cell array for the use of a word line strap structure and, thereby, an increase in the area of the memory cell array is caused.

In addition, a power supply line for supplying the power supply voltage to each memory cell is conventionally formed of a wire layer, which is a layer above bit lines, and the power supply voltage is supplied to each memory cell by making a contact to this upper layer power supply line and, therefore, there is a problem wherein the IR drop becomes large.

SUMMARY OF THE INVENTION

An object of the present invention is to provide a semiconductor memory device that allows high speed memory operation without causing an increase in the area of the memory cell portion.

Another object of the present invention is to provide a semiconductor memory device that can reduce the IR drop.

A semiconductor memory device of the present invention is provided with: word lines, making up a plurality, aligned parallel to each other; bit lines, making up a plurality, aligned parallel to each other in the direction crossing the word lines; memory cells, making up a plurality, connected to the word lines and to the bit lines; strap lines, making up a plurality, located above the word lines; and contacts, making up a plurality, formed between the bit lines for electrically connecting the word lines to the strap lines.

According to this configuration, the contacts for connecting the word lines to the strap lines are provided between the bit lines and it is not necessary to separately provide strapping regions at the ends of the memory cell array portions (plurality of memory cell regions) and it is not necessary to increase the intervals between memory cells by increasing the size of memory cells according to a standard CMOS process layout and, therefore, contacts for strapping word lines can be provided for each memory cell without the necessity of increase in the areas of the memory cell array portions or increase in the chip area and, thereby, propagation delay of drive signals of word lines can be prevented and high speed memory operation can be implemented.

In this case, each memory cell may be formed of a MOS transistor and a MOS capacitor and, thereby, the pitch between memory cells becomes large and the intervals between bit lines become large so that the contacts for strapping the word lines can easily be arranged between the bit lines.

In accordance with another aspect, a semiconductor memory device of the present invention is provided with: word lines, making up a plurality, aligned parallel to each other; bit lines, making up a plurality, aligned parallel to each other in the direction crossing the word lines; memory cells, making up a plurality, connected to the word lines and to the bit lines; and metal wires, making up a plurality, formed between the bit lines so as to be parallel to the bit lines for electrically connecting the memory cells to a power supply line.

According to this configuration, metal wires connected to the power supply line, which is in an upper layer, are provided between the bit lines and it is not necessary to increase the intervals between the memory cells by increasing the size of the memory cells according to a standard CMOS process layout in order to align these metal wires and, therefore, increase in area of the memory cell array portions and increase in chip area are not necessary. Thus, the power supply voltage is supplied to the memory cells from the metal wires connected to the power supply line and provided between the bit lines and, therefore, the IR drop of the power supply line can be reduced. In addition, the metal wires are formed parallel to the bit lines and, therefore, function as shield lines for reducing noise along the bit lines.

In this case, each memory cell may be formed of a MOS transistor and a MOS capacitor and, thereby, the pitch between memory cells becomes large and the intervals between bit lines become large so that the metal wires connected to the power supply line can easily be aligned between the bit lines.

In accordance with another aspect, a semiconductor memory device of the present invention is provided with: word lines, making up a plurality, aligned parallel to each other; bit lines, making up a plurality, aligned parallel to each other in the direction crossing the word lines; memory cells, making up a plurality, connected to the word lines and to the bit lines; strap lines, making up a plurality, aligned above the word lines; contacts, making up a plurality, formed between the bit lines so as to electrically connect the word lines to the strap lines; and metal wires, making up a plurality, formed between the bit lines so as to be parallel to the bit lines for electrically connecting the memory cells to a power supply line, wherein the contacts and the metal wires are arranged in an alternating manner between the bit lines.

According to this configuration, the contacts for connecting word lines to strap lines and metal wires connected to the power supply line are arranged, in an alternating manner, between bit lines and, therefore, the area of memory cell array portions and the chip area are not increased in order to arrange the contacts or metal wires so that high speed memory operation can be implemented and reduction in the IR drop of the power supply line and reduction in noise along the bit lines can be achieved.

In this case, each of the memory cells may be formed of a MOS transistor and a MOS capacitor and, thereby, the pitch between memory cells is increased and the intervals between bit lines also is increased so that the contacts for strapping word lines and metal wires connected to the power supply line can easily be arranged between the bit lines.

BRIEF DESCRIPTION OF THE DRAWINGS

FIG. 3 is a layout diagram of a memory cell array portion of a semiconductor memory device according to the third embodiment of the present invention; and FIG. 4 is a layout diagram of a memory cell array portion designed using a conventional process for a DRAM integrated chip.

DESCRIPTION OF THE PREFERRED EMBODIMENTS

The embodiments of the present invention are described in reference to the drawings.

[First Embodiment]

Figure 1:
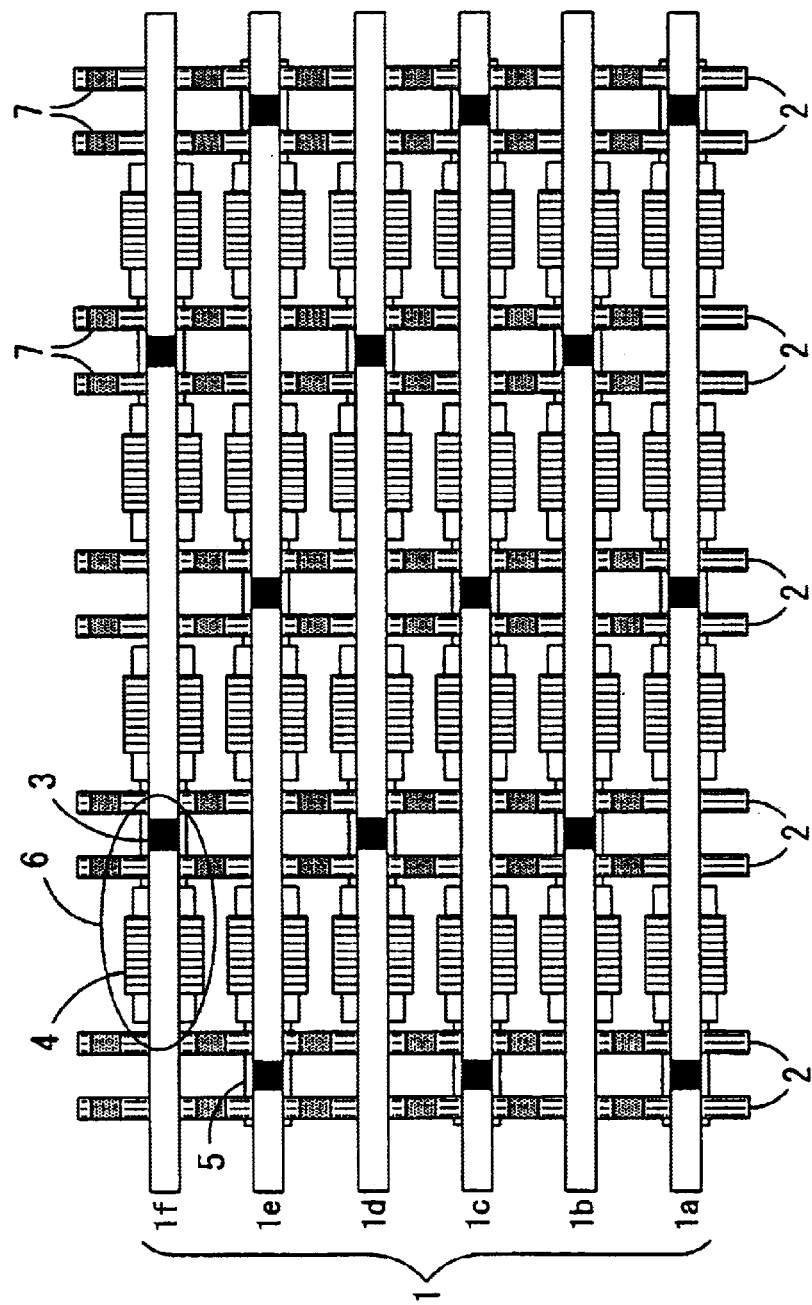
FIG. 1 is a layout diagram of a memory cell array portion of a semiconductor memory device according to the first embodiment of the present invention.

FIG. 1 shows a semiconductor memory device of the first embodiment of the present invention and is a layout diagram of a memory cell array portion formed using a standard CMOS process. Here, the memory cell array portion formed using the standard CMOS process has a planar-type memory cell structure wherein a memory cell is formed of a MOS transistor and a MOS capacitor, instead of a memory cell structure, such as a stacked type or a trench type, which require special processing.

In FIG. 1, bit lines formed of low resistance metal wires (first layer aluminum wires, for example) are denoted as 1a to 1f. Word lines, which work as gate electrodes of transistors for selectively connecting the memory cells to the bit lines and formed of polysilicon wires, aligned in the direction crossing the bit lines, are denoted as 2. In addition, low resistance metal wires, which are omitted in the drawings, that become strap lines formed to have the same pitch as word lines 2 are formed in a layer above word lines 2. 1Tr1C-type memory cells of a DRAM arranged at the respective points of intersection of word lines 2 and bit lines 1, and formed of memory cell capacitors 4, which are MOS capacitors, and memory cell transistors 5, which are MOS transistors, are denoted as 6. Memory cells 6 are connected to word lines 2 and bit lines 1. Bit line contacts for electrically connecting bit lines 1 to memory cell transistors 5 are denoted as 3 and memory cell capacitors are denoted as 4. Word line strap contacts, which become strap lines, for electrically connecting the low resistance metal wires in an upper layer formed along word lines 2, having the same pitch as word lines 2, to word lines 2 are denoted as 7.

A memory cell array portion formed using the standard CMOS process as the above semiconductor memory device has a layout wherein the pitch of memory cell capacitors 4 aligned in the longitudinal direction of word lines 2 is large. The intervals between memory cells 6 adjacent to each other in the longitudinal direction of word lines 2 are determined by the pitch of memory cell capacitors 4 and, therefore, the intervals between bit lines 1, which are connected to memory cells 6, also become large and it becomes possible to provide strap contacts 7 for word lines 2 between bit lines 1 using metal wires in the same layer as bit lines 1, without providing strapping regions at the edge of the memory cell array.

According to the present embodiment, strap contacts 7 for strapping word lines 2 to the low resistance metal wires that become strap lines can be provided for each memory cell 6. Accordingly, the propagation delay of signals from the driving end to the terminal of a word line 2 can be restricted so that a period of time from the start of application of a drive signal to word line 2 to the transfer, to a bit line 1, of data of a memory cell 6 is shortened and high speed memory operation can be achieved.

In addition, it is not necessary to separately provide strapping regions at the ends of the memory cell array, nor is it necessary to increase the intervals between the memory cells by increasing the size of the memory cell in a layout according to the standard CMOS process, and, therefore, the area of memory cell array portions and the chip area are not increased.

Here, though in the present embodiment word line strap contacts 7 are arranged between respective bit lines 1, the contacts may be arranged for every two bit lines, for every three bit lines, for every four bit lines, or the like, in the configuration.

[Second Embodiment]

Figure 2:
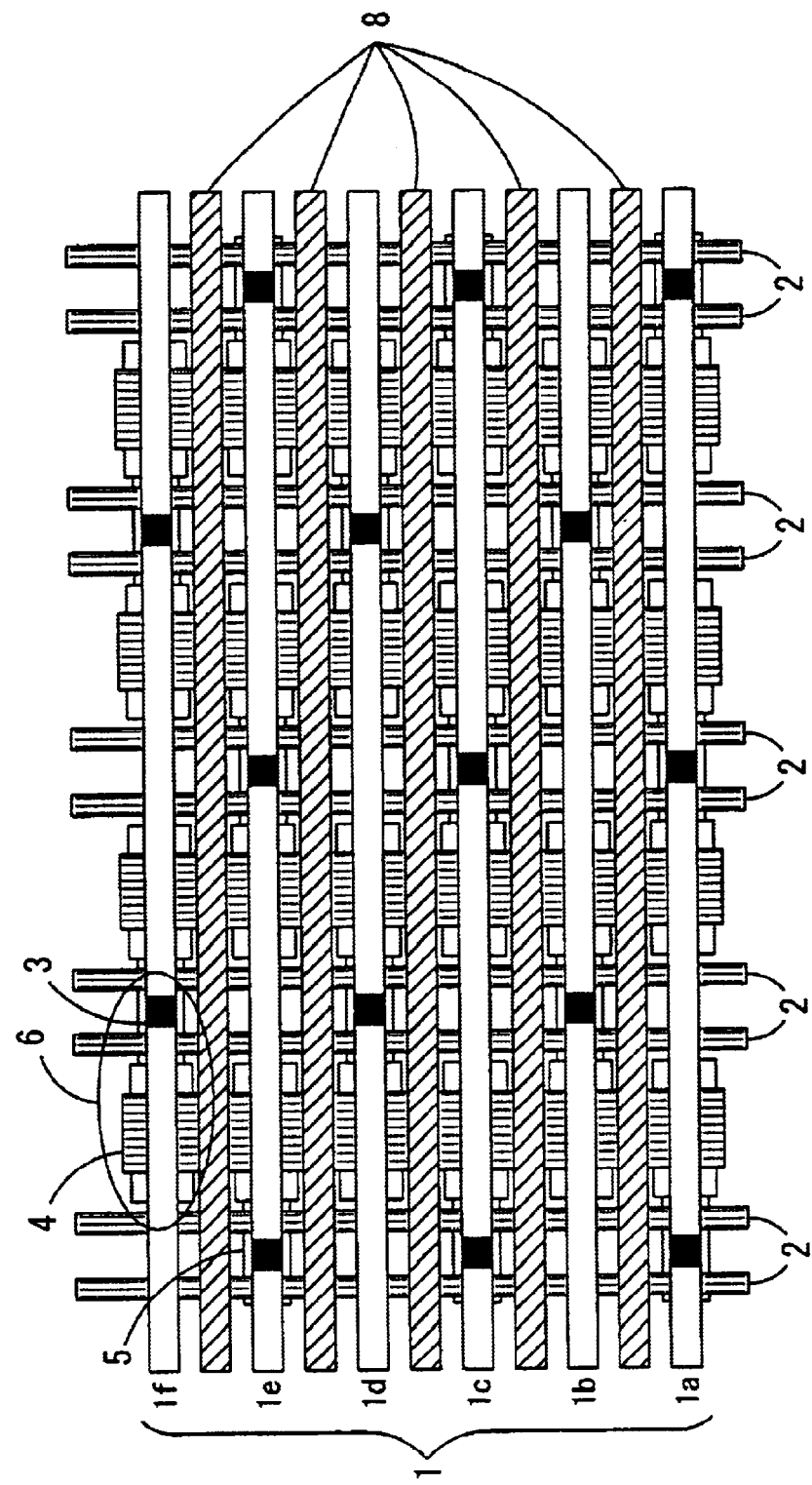
FIG. 2 is a layout diagram of a memory cell array portion of a semiconductor memory device according to the second embodiment of the present invention.

FIG. 2 shows a semiconductor memory device according to the second embodiment of the present invention and is a layout diagram of a memory cell array portion formed using a standard CMOS process. The same symbols as for the components shown in FIG. 1 are attached to the same components in FIG. 2, and descriptions thereof are omitted. In FIG. 2, low resistance metal wires formed of metal wires in the same layer as bit lines 1 and aligned parallel to bit lines 1 are denoted as 8. These metal wires 8 are electrically connected to a DRAM power supply line (not shown), running in a layer above the memory cell array and formed of a metal wire in a layer above bit lines 1 and metal wires 8, and are connected to memory cells 6 so as to supply the power supply voltage to memory cells 6.

A memory cell array portion formed using the standard CMOS process as the above semiconductor memory device has a layout wherein the pitch of memory cell capacitors 4 aligned in the longitudinal direction of word lines 2 is large. The intervals between memory cells 6 adjacent to each other in the longitudinal direction of word lines 2 are determined by the pitch of memory cell capacitors 4 and, therefore, the intervals between bit lines 1, which are connected to memory cells 6, also become large and low resistance metal wires 8 can be aligned between bit lines 1 so as to be parallel to bit lines 1 while using metal wires in the same layer as bit lines 1.

According to the present embodiment, low resistance metal wires 8 aligned between bit lines 1 are electrically connected to a DRAM power supply line in an upper layer via the metal wires in the same layer as bit lines 1, and metal wires 8 are connected to memory cells 6 so that the power supply voltage is supplied to memory cells 6 and, thereby, reduction in the IR drop of the DRAM power supply becomes possible. In addition, these low resistance metal wires 8 become power supply lines aligned parallel to bit lines 1 and, therefore, act as shield lines having the effect of reducing noise along the bit lines.

In addition, since metal wires 8 are aligned between bit lines 1, it is not necessary to increase the intervals between the memory cells by increasing the size of the memory cell in a layout according to the standard CMOS process, nor is it necessary to increase the area of the memory cell array or the chip area.

Here, though in the present embodiment metal wires 8 are aligned between respective bit lines 1, the wires may be aligned for every two bit lines, for every three bit lines, for every four bit lines, or the like, in the configuration.

[Third Embodiment]

FIG. 3 shows a semiconductor memory device according to the third embodiment of the present invention and is a layout diagram of a memory cell array portion formed using a standard CMOS process. The same symbols as for the components shown in FIG. 1 are attached to the same components in FIG. 3, and descriptions thereof are omitted. In FIG. 3, word line strap contacts for electrically connecting word lines 2 to low resistance metal wires (not shown) in a layer above word lines 2 that become strap wires formed along word lines 2 so as to have the same pitch as that of word lines 2 are denoted as 7. Low resistance metal wires formed of metal wires in the same layer as bit lines 1 and aligned parallel to bit lines 1 are denoted as 8. These metal wires 8 are electrically connected to a DRAM power supply line extending in a layer above the memory cell array and formed of metal wires in a layer above bit lines 1 and above metal wires 8, and are connected to memory cells 6 so as to supply the power supply voltage to memory cells 6.

A memory cell array portion formed using the standard CMOS process as the above semiconductor memory device has a layout wherein the pitch of memory cell capacitors 4 aligned in the longitudinal direction of word lines 2 is large. The intervals between memory cells 6 adjacent to each other in the longitudinal direction of word lines 2 are determined by the pitch of memory cell capacitors 4 and, therefore, the intervals between bit lines 1, which are connected to memory cells 6, also become large and it becomes possible to provide strap contacts 7 for strapping, and connecting, word lines 2 to low resistance metal wires in an upper layer that become strap lines in the form of metal wires in the same layer as bit lines 1 between, for example, first bit line 1a and second bit line 1b. In addition, a low resistance metal wire 8 in the same layer as bit lines 1 can be aligned parallel to bit lines 1 between, for example, second bit line 1b and third bit line 1c.

As described above according to the present embodiment, it becomes possible to strap word lines 2 without increasing the area of memory cell arrays or the chip area, as described in the first and second embodiments, and propagation delay in drive signals, from the driving end to the terminal of a word line 2, can be reduced, and a period of time from the start of application of a drive signal to a word line 2 to the transfer of data of a memory cell 6 to a bit line 1 can be shortened so that high speed memory operation can be achieved. In addition, low resistance metal wires 8 are electrically connected to the DRAM power supply line in an upper layer and metal wires 8 are connected to memory cells 6 so as to supply the power supply voltage to memory cells 6 and, thereby, reduction in the IR drop of the DRAM power supply becomes possible. Furthermore, low resistance metal wires 8 become power supply lines aligned parallel to bit lines 1 and, therefore, function as shield lines for reducing noise along the bit lines.

Here, though in the present embodiment word line strap contacts 7 and metal wires 8 aligned between bit lines 1 are provided in an alternating manner, a configuration is also possible wherein word line strap contacts 7 are arranged for every two bit lines, every three bit lines or every four bit lines so that metal wires 8 are aligned between bit lines wherein no word line strap contacts 7 are provided.

In addition, in the case of a memory cell structure formed using a standard CMOS process, such as the in first to third embodiments, an increase in yield as well as cost reduction can be achieved, in comparison with the case of a memory cell structure formed using a special process, such as of a stacked type or trench type.

Here, the present invention is not limited to these embodiments but, rather, can, of course, be modified within the scope of the invention such that the gist is not deviated from. Though in the above described embodiments cases are described wherein, for example, the present invention is applied to a large capacity DRAM, the present invention is not limited to DRAMs but also has wide applications for other semiconductor memories and, in particular, can be applied to a semiconductor memory wherein high speed is required.

What is claimed is:

1. A semiconductor memory device, comprising:

a plurality of word lines aligned parallel to each other;

a plurality of bit lines aligned parallel to each other in a direction crossing said word lines;

a plurality of memory cells connected to said word lines and to the bit lines;

a plurality of strap lines located above said word lines; and a plurality of contacts for electrically connecting said word lines to said strap lines respectively, each of said contacts being formed at a respective spacing between two adjacent ones of said bit lines within a memory cell array portion.

2. A semiconductor memory device, comprising:

a plurality of word lines aligned parallel to each other;

a plurality of bit lines aligned parallel to each other in a direction crossing said word lines;

a plurality of memory cells connected to said word lines and to the bit lines; and a plurality of metal wires for electrically connecting said memory cells to a power supply line, each of said metal wires being formed at a respective spacing between two adjacent ones of said bit lines within a memory cell array portion in a same layer as said bit lines.

3. A semiconductor memory device, comprising:

a plurality of word lines aligned parallel to each other;

a plurality of bit lines aligned parallel to each other in a direction crossing said word lines;

a plurality of memory cells connected to said word lines and to the bit lines;

a plurality of strap lines aligned above said word lines;

a plurality of contacts for electrically connecting said word lines to said strap lines respectively, each of said contacts being formed at a respective spacing between two adjacent ones of said bit lines within a memory cell array portion; and a plurality of metal wires for electrically connecting said memory cells to a power supply line, each of said metal wires being formed at a respective spacing between two adjacent ones of said bit lines within said memory cell array portion in a same layer as said bit lines, wherein said contacts and said metal wires are arranged in an alternating manner among said bit lines.

4. The semiconductor memory device according to claim 1, wherein each memory cell comprises a MOS transistor and a MOS capacitor.

5. The semiconductor memory device according to claim 2, wherein each memory cell comprises a MOS transistor and a MOS capacitor.

6. The semiconductor memory device according to claim 3, wherein each memory cell comprises a MOS transistor and a MOS capacitor.

* * * * *